Figure 1:
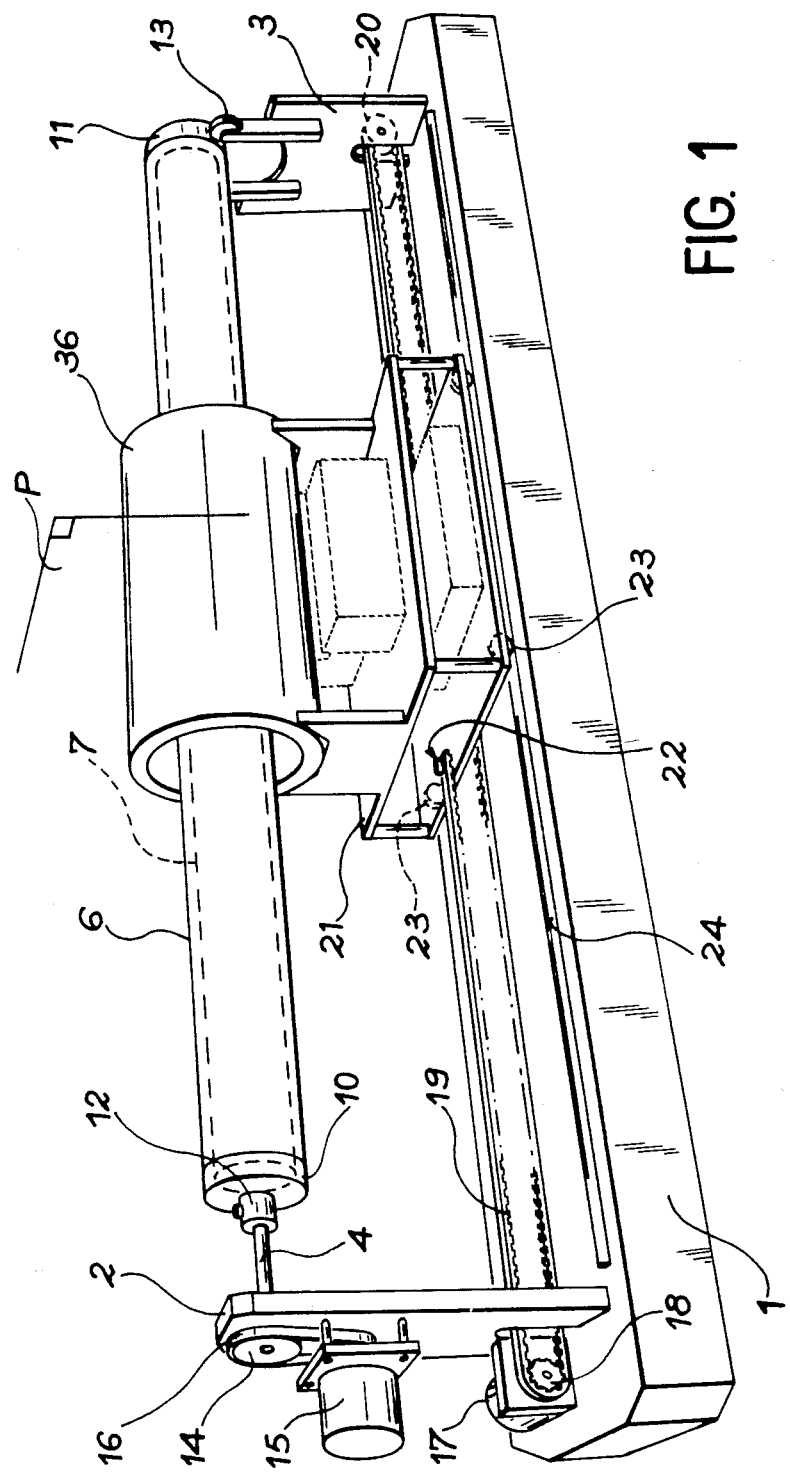

United States Patent [19]

Blanpain et al.

[11] Patent Number: 4,788,504
[45] Date of Patent: Nov. 29, 1988

[54] APPARATUS FOR MEASURING THE RESIDUAL MAGNETIZATION VECTOR IN CYLINDRICAL COORDINATES OF A GEOLOGICAL CORE SAMPLE

[75] Inventors: Roland Blanpain, St Laurent du Pont; Patrick Le Masson, Villard de Lans; Jacques Pocachard, Voreppe; Bertrand Sichler, Plouzane, all of France

[73] Assignee: Commissariat a l'Energie Atomique, Paris, France

[21] Appl. No.: 119,561

[22] Filed: Nov. 12, 1987

[30] Foreign Application Priority Data

Nov. 28, 1986 [FR] France ............... 86 16652

[51] Int. Cl.[4] ............ G01V 3/08; G01V 3/40; G01R 33/12
[52] U.S. Cl. ............... 324/377; 324/261; 324/243
[58] Field of Search ......... 324/376, 377, 323, 345, 324/257, 258, 260, 244, 261, 262, 205

[56] References Cited

U.S. PATENT DOCUMENTS

| | | | |
|---|---|---|---|
| 2,334,393 | 11/1943 | Dillon | 324/377 |
| 2,701,335 | 2/1955 | Sergeant et al. | 324/258 X |
| 2,757,335 | 7/1956 | Bellugue | 324/258 |
| 3,387,377 | 6/1968 | Patton | 324/358 X |
| 3,686,563 | 8/1972 | Walter | 324/377 |
| 3,820,012 | 6/1974 | Molyneux | 324/377 |

OTHER PUBLICATIONS

Journal of Physics E-Scientific Instruments, R. Hummervoll et al., vol. 13, 1980, pp. 931–936.
IEEE Transactions on Magnetics, Mahgoub Mohed Ahmed Omer et al., vol. MAG-14, No. 1, Jan. 1978, pp. 17–21.
Journal of Physics E-Scientific Instruments, G. Chiron et al., vol. 14, No. 8, Aug. 1981, pp. 977–980.

Primary Examiner—Reinhard J. Eisenzopf
Assistant Examiner—Warren S. Edmonds
Attorney, Agent, or Firm—Pearne, Gordon, McCoy & Granger

[57] ABSTRACT

Apparatus for measuring the residual magnetization vector in cylindrical coordinates of a geological core sample. It comprises a carriage carrying a solenoid made to longitudinally vibrate for determining the longitudinal component of the vector and ferromagnetic transducers which determine the radial component and the phase of the radial component of the vector by rotating the core sample. The measurements are automatically integrated.

4 Claims, 2 Drawing Sheets

APPARATUS FOR MEASURING THE RESIDUAL MAGNETIZATION VECTOR IN CYLINDRICAL COORDINATES OF A GEOLOGICAL CORE SAMPLE

The present invention relates to an apparatus for automatically measuring the components, in accordance with a cylindrical market, of the residual magnetization vector of a geological sample.

Magnetometry groups numerous practical processes for measuring magnetic characteristics of natural bodies, but not all are intended for measurements in accordance with three dimensions. Moreover, the often large size of the samples taken leads to new limitations in the possible measuring means, particularly if it is wished to perform a non-destructive measurement.

Two processes are generally used for measuring the residual magnetization vector.

The first process used magnetometric transducers of the ferromagnetic film type or of the fluxmeter type. Apparatuses using this process suffer from the two following disadvantages. The supported samples have small dimensions (approximately diameter 2.5 cm and length 2.5 cm), which makes it necessary to cut up, i.e. destroy the geological core sample. The residual magnetization vector is obtained from a calculation relating to the results of measurements performed in a accordance with three positions of the sample. These sample turning operations require the intervention of an operator and increase the measuring time.

The second process uses magnetometric transducers of the SQUID type (Superconducting Quantum Interference Devices). This permits the measurement to be carried out on larger samples, i.e. with a diameter of approximately 7.5 cm and with a length up to 1 m. The apparatuses produced according to this process have great sensitivity. However, as the transducers must work at a temperature close to absolute zero, they require liquid helium cooling, which constitutes an important constraint.

Thus, the present invention proposes a simply designed apparatus making it possible to measure the residual magnetic characteristics of geological core samples with a relatively large size, namely a diameter of 10 cm for a length of 1 m, both as regards the longitudinal component of the residual magnetization vector and its radial component and the phase $\theta$ of the latter in a system of cylindrical coordinates (x, r, $\theta$) with respect to a reference determined by the user. The different stages of the measurement are controlled by a microprocessor.

The measuring apparatus constituting the object of the invention is essentially in the form of a bench ensuring the positioning, support and rotation of the core sample about its axis. On said bench slides a carriage having directional magnetometric transducers for measuring the radial component of the magnetization (modulus and phase with respect to a reference) and a vibrating coil for measuring the longitudinal component. The coil is in the form of a very light, flat solenoid coaxial to the core sample and which can perform a low amplitude, sinusoidal translatory movement at a frequency of a few hertz.

The apparatus also makes it possible to perform several measurements at different locations along the core sample. The apparatus will be better understood from the following description relative to non-limitative embodiments and the attached drawings, wherein show:

FIG. 1 An overall perspective view of the apparatus

Figure 2:
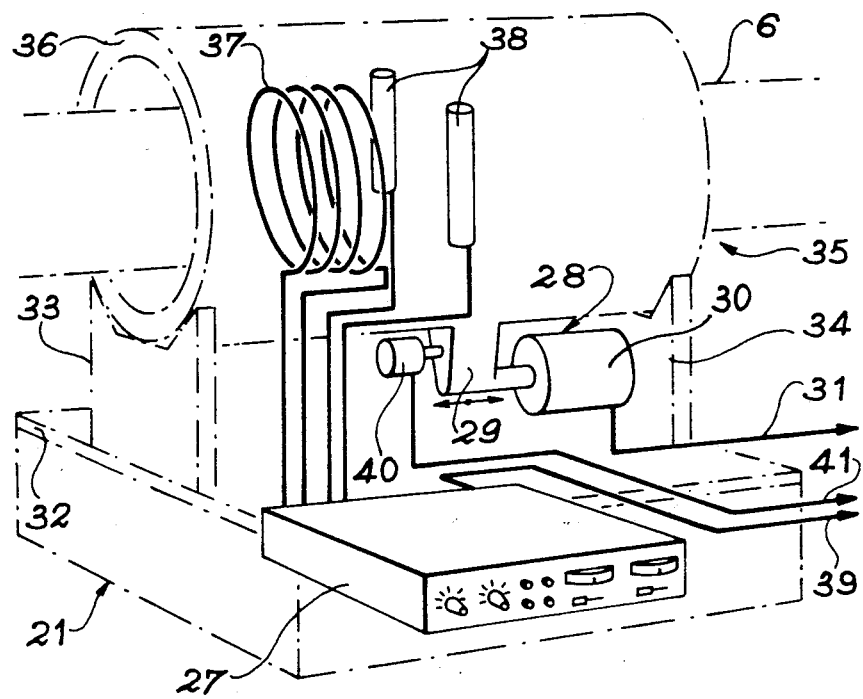

FIG. 2 In perspective, the part of the apparatus more particularly comprising the radial magnetic field transducers and the solenoid.

Figure 3:
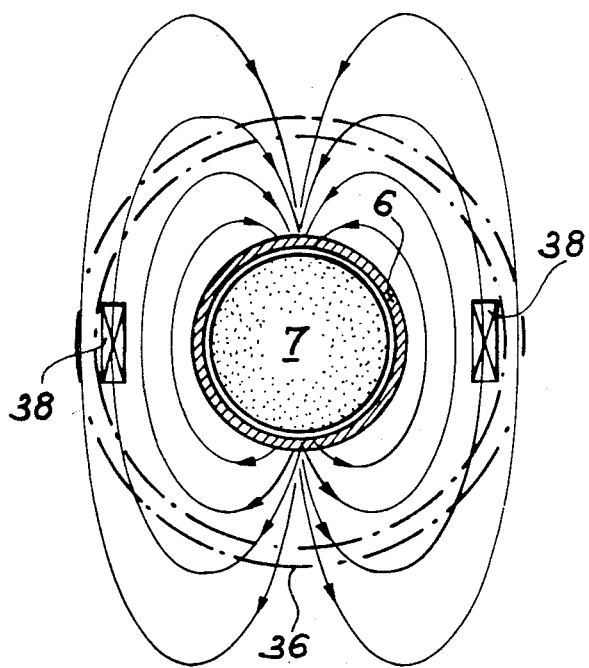

FIG. 3 Along plane P of FIG. 1, explains the operation of the apparatus for measuring the radial component of the residual magnetic field of the core sample.

Thus, according to FIG. 1, the invention comprises a longitudinally positioned frame 1 having a horizontal surface at its top and at the ends of which are located two vertical bars 2, 3, whereof one 2 is perforated at its top so as to receive a spindle 4 used for maintaining in place a nonferromagnetic material tube 6 in which is placed the geological core sample 7, whose residual magnetism is to be measured. The second bar 3 is provided with rollers 13, which constitute a simple support for tube 6. The fixing of spindle 4 to tube 6 can take place by means of a plug 10 fitting into the corresponding end of tube 6 and provided with a collet 12 on spindle 4. A second detachable plug 11 permits the loading and maintaining in place of the core sample in tube 6. To bar 2 is fitted a system formed by a pulley 14, an electric motor 15 and a belt 16, so that tube 6 is rotated in the manner of a pin via spindle 4.

The invention also comprises a second electric motor 17 positioned on bar 2, which drives a pulley 18 having a serrated belt 19, which passes over the entire length of frame 1 and whose tension is ensured by another pulley 20 located on the second bar 3. Serrated belt 19 drives in translation a carriage 21 fixed thereto by a bolted flange 22 and which is displaced on frame 1 by means of rollers 23 mounted on ballbearings and connected to rails 24.

On said carriage 21, which is more particularly shown in FIG. 2 are fixed a box 27 containing the electronics for amplifying and filtering the signals from the transducers, as well as a vibration generator 28 conventionally constituted by an exciting structure 29 and a body 30 within which the sinusoidal electric signal supplied by a cable 31 is transformed into a mechanical movement. Generator 28 is fixed to a horizontal plate 32. A phase transducer 40 having a spindle integral with the exciting structure 29 transmits the vibration reference necessary for synchronous detection to a microprocessor system by means of a cable 41. Crossbars 33, 34 on carriage 21 support an assembly 35 constituted by a rigid cylindrical magnetic shielding 36 connected to a generator 28, a solenoid 37 within said shielding 36 and two magnetic transducers 38 of the ferromagnetic film type positioned in diametrically opposing manner on the interior of shielding 36 in accordance with a preferred embodiment of the invention. However, a different number of transducers 38 can be used without prejudicing the present principle described hereinafter.

The measurements performed with this apparatus firstly comprise of enclosing the geological core sample 7 in tube 6 and securing it with the aid of plug 11. The measurements are performed automatically, the same microprocessor controlling the displacement of the carriage along the core sample, the different measuring stages and the storage of said measurements, after which it analyses the same.

For measuring the radial component of the residual magnetic field, as well as the phase with respect to a fixed reference, use is made of the two magnetic transducers 38 according to FIG. 3. The geological core sample 7 performs a rotary movement as a result of motor 15 and a speed of two revolutions per second is adequate for certain embodiments of the invention.

Each of the two transducers 38 measures a magnetic field equal to $K \cdot I_R \cdot \cos(\omega t + \phi)$, in which $I_R$ is the modulus of the radial residual magnetization of core sample 7, i.e. the quantity to be measured, K is a constant dependent on the distance from transducer 38 to the rotation axis of core sample 7 and $(\omega t + \phi)$ represents the core sample rotation angle as a function of time and with respect to a given angular reference. A synchronous detection with as the reference a sinusoidal signal linked with the rotation of the core sample makes it possible to determine $I_R$ and $\phi$. By increasing the number of transducers of the radial component, it is possible to reduce the effect of a poor centring and reduce the uncertainty on quantity K.

The measurement of the longitudinal component of the residual magnetization of core sample 7 is brought about by making solenoid 37 longitudinally vibrate by means of vibration generator 28. The magnetic flux $\phi$ across solenoid 37 is equal to the convolution product of the longitudinal magnetization by the first Anderson function which, for each measuring point on the core sample, expresses the influence of its magnetization on the solenoid 37 as a function of its distance for spacing. It makes it possible to produce a sinusoidal induced voltage in solenoid 37, which is proportional to the variation of flux $\phi$ and to the pulsation of the mechanical vibrations transmitted thereto. The signals from transducers 38 and solenoid 37 are passed to box 27, which ensures the amplification and filtration thereof and they are then transmitted by a multicore cable 39 to the microprocessor system, with a view to digitization, synchronous detection and real time integration.

Multiple measurements can be performed on different measuring points along core sample 7. It is merely necessary to start up motor 17 for moving carriage 21 and solenoid 37 parallel to the axis of sample 7. In place of solenoid 37, the prior art uses magnetic detectors which have to be placed at the longitudinal end of the sample, which makes it necessary to cut up the latter in order to measure a longitudinal magnetization in a median part.

After obtaining rough measurements, a digital integration and deconvolution process makes it possible to provide the longitudinal magnetization characteristics of the different measuring points on core sample 7.

Thus, this apparatus offers an attractive and easily usable alternative to the hitherto known methods. It is possible to use core samples of a relatively large size without any need to cut them into short portions. Measurement is automatic and fast and handling operations are reduced to the minimum.

In its present configuration, the invention includes two diametrically opposite magnetic transducers 38 spaced by twice the diameter of the core sample 7 and a 6000 turn solenoid 37 with an approximate length of 0.5 cm. For core samples with a length of 1 m and a diameter of 10 cm, the sensitivity is $10^{-4}$A/m for the radial component and $3 \cdot 10^{-4}$A/m/cm in gradient for the axial component for respective measuring times of 100 seconds and 10 seconds per measuring point.

We claim:

1. Apparatus for measuring the residual magnetization vector in cylindrical coordinates (x, r, $\theta$) of the geological core sample (7) about an axis of said sample (7), the residual magnetization vector having a longitudinal component (x) along said axis and a radial component (r) perpendicular to said axis, said radial component making an angular phase ($\theta$) with a preset angular reference, said apparatus comprising: means (2, 3, 6) for supporting said sample (7) while rotating said sample about said axis, a carriage (21) sliding along said axis of said core sample and provided with transducers (38) for measuring the radial component and the phase of said vector by variation during rotation of said sample of a magnetic field generated by said radial component and detected by said transducers, said carriage being also provided with a solenoid (37) for measuring the longitudinal component (x), said solenoid being vibrated longitudinally to generate therein an electric current depending from induction by said longitudinal component, and means (39) for measuring said electric current in said solenoid.

2. Measuring apparatus according to claim 1, wherein a vibration generator (28) having a body (30) is secured to said carriage and an exciting structure (29) to which said solenoid (37) is secured, said vibration generator transmitting a sinusoidal electric signal into a mechanical movement of the exciting structure.

3. Measuring apparatus according to claim 1, wherein the means for measuring the electric current in the solenoid measure voltage between terminals of the solenoid.

4. Measuring apparatus according to claim 1, comprising means, including a microprocessor, for automatically processing the measurements of the residual magnetization vector in real time.

* * * * *